United States Patent [19]
Ettenberg et al.

[11] 3,963,536

[45] June 15, 1976

[54] METHOD OF MAKING ELECTROLUMINESCENT SEMICONDUCTOR DEVICES

[75] Inventors: Michael Ettenberg, Freehold; Henry Kressel, Elizabeth, both of N.J.

[73] Assignee: RCA Corporation, New York, N.Y.

[22] Filed: Nov. 18, 1974

[21] Appl. No.: 524,758

[52] U.S. Cl. .............. 148/171; 148/172; 252/62.3 GA; 331/94.5 H; 357/16
[51] Int. Cl.² .................................. H01L 7/38
[58] Field of Search ......... 148/171, 172, 173, 186; 252/62.3 GA; 331/94.5 H; 357/16, 17, 18

[56] References Cited
UNITED STATES PATENTS

| | | | |
|---|---|---|---|
| 3,537,029 | 10/1970 | Kressel et al. | 148/171 X |
| 3,560,275 | 2/1971 | Kressel et al. | 148/171 |
| 3,647,579 | 3/1972 | Ladany | 148/171 |
| 3,676,228 | 7/1972 | Sakurai et al. | 148/171 |
| 3,713,883 | 1/1973 | Lien | 148/172 X |
| 3,752,713 | 8/1973 | Sakuta et al. | 148/171 |
| 3,783,825 | 1/1974 | Kobayashi et al. | 148/172 X |

*Primary Examiner*—G. Ozaki
*Attorney, Agent, or Firm*—Glenn H. Bruestle; Daniel N. Calder

[57] ABSTRACT

In making electroluminescent devices comprised of layers of semiconductor material of different conductivity types, the layers are formed by a liquid phase epitaxy process in which the layer growth rate is accelerated by means of rapid cooling. The rapid cooling during deposition results in a device having resistance to the gradual degradation of light emission.

8 Claims, 2 Drawing Figures

METHOD OF MAKING ELECTROLUMINESCENT SEMICONDUCTOR DEVICES

The invention disclosed herein was made in the course of, or under, a contract or subcontract thereunder with the Department of the Navy.

BACKGROUND OF THE INVENTION

The present invention relates to a method of fabricating electroluminescent devices and more specifically to a method of fabricating electroluminescent devices having improved resistance to degradation of light emission.

In the field of III-V compound P-N junction electroluminescent devices a problem that has existed is gradual degradation. Degradation is an electroluminescent device is when the generated light output is reduced as a function of time at a given current drive. This reduction in light output occurs in the course of device operation without any evidence of mechanical damage.

Electroluminescent devices can be of two types; when the electroluminescent radiation is incoherent, the diode source is described as a light-emitting diode, and when the radiation is coherent, the source is described as a laser.

The phenomenon of gradual degradation is a superlinear function of the current density of operation and results from the formation of nonradiative centers in the recombination region. One possibility for the formation of these nonradiative centers is clustering of point defects in the recombination region. That is to say, for gradual degradation to proceed, there must be present dislocation multiplication or impurity diffusion. For these phenomena to take place, there must be a substantial number of point defects present in the crystal. Among the most important of these defects are vacancies, for a large number of vacancies can account for movements of dislocations and impurities during operation. Therefore, a method by which electroluminescent devices can be fabricated having a lesser number of vacancies would be most desirable for the reduction of gradual degradation.

SUMMARY OF THE INVENTION

A method for fabricating an electroluminescent device having a recombination region, by depositing the semiconductor material of the device from the liquid phase, so that at least the portion deposited in the vicinity of the recombination region is deposited at a rate greater than 10 microns per minute.

DETAILED DESCRIPTION OF THE INVENTION

Figure 1:
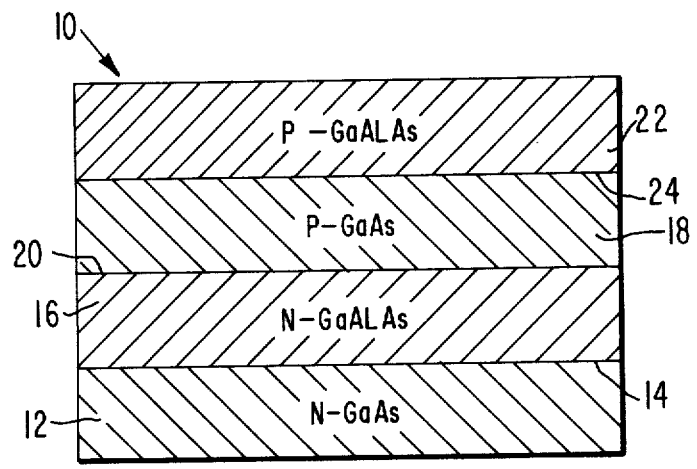
FIG. 1 is a cross-sectional view of a multi-layer, light-emitting diode made by the method of the present invention.

Referring to FIG. 1, a high radiance double heterojunction light-emitting diode 10 consists of a gallium arsenide substrate 12 of n-type conductivity having three consecutive conductivity layers 16, 18 and 22. A first conductivity layer 16 on a surface 14 of the substrate 12 is of n-type gallium aluminum arsenide, and a second conductivity layer 18 of p-type gallium arsenide is on the first layer 16, opposite the substrate 12. The second conductivity layer 18 is the recombination region of diode 10, that is, the region where incoherent light is generated by the recombination of hole and electron carriers. Between the first layer 16 and the second layer 18, is a first heterojunction 20. A third conductivity layer 22 of p-type gallium aluminum arsenide is on a surface of the second layer 18, opposite the first layer 16. A second heterojunction 24 is between the second layer 18 and the third layer 22.

Figure 2:
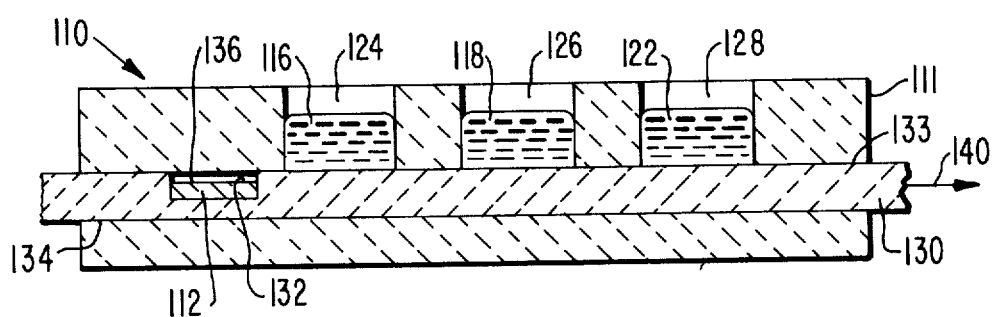
FIG. 2 is a cross-sectional, schematic view of an apparatus for carrying out the method of the present invention.

Referring to FIG. 2, an apparatus suitable for carrying out a method of fabricating a light-emitting diode 10 having a resistance to gradual degradation is generally designated as 110. The apparatus 110 comprises a refractory furnace boat 111 which is of an inert material such as graphite. The boat 111 is provided with a first well 124 spaced from a second well 126 and a third well 128 spaced from the second well 126. In addition, a passage 134 extends longitudinally through the boat 111 from one end to the other end and extends across the bottoms of the wells 124, 126 and 128. A moveable slide 130 of a refractory material, such as graphite, moveably extends through the passage 134 so that upper surface 133 of the slide 130 forms the bottom surface of the wells 124, 126 and 128. A recess 132 is provided in the upper surface 133 of the slide 130, near one end of the slide 130. The recess 132 is large enough to accommodate a substrate 112 which is to be utilized. The substrate 112 is positioned in the recess 132 so that the deposition surface 136 is uppermost. Advantageously, the deposition surface 136 is parallel to the upper surface 133 of the slide 130, and the substrate 112 nearly fills the recess 132. The substrate 112 is of the same semiconductor material as the substrate 12 of the light-emitting diode 10.

To fabricate the light-emitting diode 10 having resistance to gradual degradation, a first charge is placed in well 124 and, a second charge is placed in well 126 and a third charge is placed in well 128. Each charge is a mixture of a semiconductor material of the layer to be deposited, a metal solvent for the semiconductor material and a conductivity modifier. The semiconductor material in the first charge is gallium arsenide and aluminum, in the second charge it is gallium arsenide, and in the third charge it is gallium arsenide and aluminum. The metal solvent for the semiconductor materials of the three charges is gallium. As for the conductivity modifiers, a donor impurity, such as tellurium of tin, is added to the first charge for deposition of an n-type layer and the acceptor impurity germanium is added in the second and third charges for deposition of p-type layers.

The semiconductor material and the conductivity modifier are present in granulated solid form at room temperature. Since the metal solvent, gallium, has a melting temperature of about 30°C., it may be present in liquid form when placed in a well at room temperature. The proportions of the ingredients of each of the charges is preferably such that when the semiconductor material is dissolved into the molten metal solvent, the resulting solution will be saturated with the semiconductor material.

The loaded furnace boat 111 is then placed in a resistance heated furnace (not shown) which has only a gold reflector around the heating coils and no other insulation. Since the furnace is uninsulated when the heating coils are turned off, they will cool down faster than a furnace which has insulation. For example, if the furnace is heated to a temperature of 900°C., when the heating coils are turned off the furnace cools down at a rate approximately greater than 18°C. per minute.

Next, the furnace is turned on to heat the contents of the furnace boat 111 to a temperature at which the ingredients of the charges are dissolved, for example between 800°C. and 950°C. for gallium arsenide and aluminum. This temperature is maintained long enough to insure complete melting and homogenization of the ingredients of the charges. Thus, the first, second and third charges become first, second and third solutions 116, 118 and 122, respectively. From the first solution 116 will be deposited a semiconductor layer the same as the first conductivity layer 16 of FIG. 1. Likewise, from the second and third solutions 118 and 122 will be deposited semiconductor layers the same as the second and third conductivity layers 18 and 22, respectively. While the temperature of the furnace is increased, a flow of high purity hydrogen is maintained through the furnace and over the boat 111.

After the furnace boat reaches a temperature at which the ingredients of the charge have been dissolved and homogenized, the slide 130 is moved in the direction of the arrow 140, so that the substrate 112 becomes the floor of the first well 124. This brings the substrate 112 into contact with the first solution 116. The heating coils of the furnace are then turned off to rapidly cool the furnace boat 111 and its contents. Rapidly cooling the first solution 116, which is already saturated with the semiconductor material, gallium aluminum arsenide, results in the solution being supersaturated with arsenic. Since we are fast cooling, more arsenic atoms stay into solution at a given temperature that would normally remain in solution had cooling been much slower. Therefore, when precipitation of the semiconductor material occurs, it is from a solution supersaturated with arsenic. The result of the rapid cooling is the deposition on the surface of the substrate 112 of a first conductivity layer rich in arsenic.

During the deposition of the semiconductor material of the first solution 116, some of the tellurium or tin conductivity modifier becomes incorporated in the lattice of the first conductivity layer 16, thus the layer is of n-type conductivity. Deposition of the first conductivity layer 16 continues until a desired thickness is reached. Since cooling is at a rate greater than 18°C. per minute, deposition from the solution will be greater than 10 microns per minute.

The slide 130 is now moved in the direction of the arrow 140 to move the substrate 112 with the first conductivity layer 16 thereon from the first well 124 to the second well 126. This brings a surface of the first conductivity region 16 into contact with the second solution 118 which is saturated with the semiconductor material gallium arsenide. Further rapid cooling of the furnace boat 111 and its contents causes the second solution 118 to be supersaturated with arsenic, resulting in the precipitation of some of the semiconductor material and the deposition of the second conductivity layer 18 rich in arsenic. Also some of the germanium conductivity modifier in the second solution 118 becomes incorporated in the lattice of the second conductivity layer 18 to provide the second conductivity layer with a p-type conductivity.

After a second conductivity layer of a desired thickness has been grown, the slide 130 is again moved in the direction of arrow 140 to bring the substrate 112 with the two layers thereon from the second well 126 to the third well 128. Now, a surface of the second conductivity layer 18 is in contact with the third solution 122 which is saturated with the semiconductor material gallium aluminum arsenide. Again, further rapid cooling of the furnace boat 111 and its contents causes the third solution 122 to be supersaturated with arsenic. Precipitation of the semiconductor material results in the deposition of a third conductivity layer 22 rich in arsenic.

With the deposition of a third conductivity layer 22 of sufficient thickness, the slide 130 is moved in the direction of the arrow 140 for the removal of the substrate with the three conductivity layers from the slide 130. The light-emitting diode 10 is lapped and electrical contacts are subsequently applied to opposite sides of the diode.

The gradual degradation of an electroluminescent semiconductor device such as a light-emitting diode is believed to be due to some structural change that occurs in the crystal lattice. Thus, stopping or slowing down the diffusion of what actually causes the degradation of light emission will solve this problem. One explanation for the reduction in degradation, as a result of the present invention, is the accelerated growth from solution of the semiconductor material forming the conductivity layers. Controlling liquid phase growth can be accomplished by varying the cooling rate at deposition. The fast cooling of the semiconductor material and the subsequent supersaturation of the arsenic provides a gallium arsenide or gallium aluminum arsenide conductivity layer closer to stoichiometric composition. This means that the gallium and arsenic in the crystal lattice are of an equal amount. Since gallium is used as a solvent for gallium arsenide and gallium arsenide with aluminum, the resulting solution is predominantly gallium and if precipitated onto a substrate without rapid cooling, some arsenic atoms, about 1 part in $10^4$, will be missing in the crystal. This deviation from a stoichiometric composition, a result of the arsenic vacancies, is one possible explanation of light emission degradation. The accelerated growth from the solution accomplished by fast cooling provides an arsenic-rich solution from which there is deposited a conductivity layer having reduced arsenic vacancies, and subsequently resistance to gradual degradation.

The high radiance double heterojunction lightemitting diode 10, if not fabricated as a result of the accelerated growth rate of the present invention, would have degradation to half power life in under 1000 hours. When diode 10 was fabricated by accelerating its growth rate greater than 10 microns per minute, it exhibited very little degradation for more than 4000 hours.

The method of the present invention has been described in the fabrication of a double heterojunction light-emitting diode 10, but it is intended to be utilized in the fabrication of a multi-layer, having two or more layers, electroluminescent semiconductor devices, such as light-emitting diodes and lasers. While in the description of the present invention all the conductivity layers were rapidly cooled, it is anticipated by this method that only the recombination region of an electroluminescent device need be rapidly cooled to reduce degradation of light emission. It is also intended that the present invention be utilized in the fabrication of electroluminescent devices having conductivity layers of an arsenide of gallium. While the second conductivity region 18, which is the recombination region of diode 10, is of p-type conductivity, the present invention is also intended for the fabrication of an electroluminescent semiconductor device in which the recombination region is of n-type conductivity. In the description of the method of the present invention, germanium was used as the p-type conductivity modifier but any other p-type conductivity modifier which also can substitute for arsenic sites in the arsenide of gallium crystal structure, such as tellurium, can be used.

The method of liquid phase epitaxy having accelerated growth deposition will reduce the gradual degradation of electroluminescent devices such as high radiance incoherent edge-emitting diodes, high-power injection lasers and continuous-wave lasers, thereby increasing the useful life of these devices.

We claim:

1. A method of fabricating an electroluminescent semiconductor device having a recombination region comprising the step of:
    depositing the semiconductor material of the device from the liquid phase wherein at least the portion deposited in the vicinity of the recombination region of the device is deposited from a solution saturated with the semiconductor material at a rate greater than 10 microns per minute by cooling said saturated solution at a rate greater than 18°C. per minute.

2. The method in accordance with claim 1 in which the semiconductor material is an arsenide of gallium, supersaturated with arsenic as a result of the rapid cooling.

3. A method of fabricating a multilayer electroluminescent semiconductor device comprising the steps of:
    providing at least two separate solutions of an arsenide of gallium in a metal solvent at least one of which is saturated with the arsenide of gallium, with at least a p-type conductivity modifier in one solution and an n-type conductivity modifier in another solution,
    moving a substrate into each solution in sequence,
    cooling each of the solutions, when the substrate is moved into a solution, to deposit from the solution a layer of an arsenide of gallium, with at least said saturated solution cooled at a rate greater than 18°C. per minute resulting in deposition at 10 microns per minute from a solution supersaturated with arsenic.

4. The method in accordance with claim 3 in which the solution cooled at a rate greater than 18°C. per minute is the solution containing the p-type conductivity modifier.

5. The method in accordance with claim 4 in which the p-type conductivity modifier is any impurity which can substitute for an arsenic site in the crystal structure of the arsenide of gallium.

6. The method in accordance with claim 5 in which the p-type conductivity modifier is germanium or tellurium.

7. The method in accordance with claim 6 in which the metal solvent is gallium.

8. The method in accordance with claim 7 in which all the solutions are cooled at a rate greater than 18°C. per minute.

* * * * *